(12) United States Patent
Okabe

(10) Patent No.: US 11,437,984 B2
(45) Date of Patent: Sep. 6, 2022

(54) DELAY CIRCUIT

(71) Applicant: ABLIC Inc., Tokyo (JP)

(72) Inventor: Shigeyuki Okabe, Tokyo (JP)

(73) Assignee: ABLIC Inc., Tokyo (JP)

( * ) Notice: Subject to any disclaimer, the term of this patent is extended or adjusted under 35 U.S.C. 154(b) by 0 days.

(21) Appl. No.: 17/516,726

(22) Filed: Nov. 2, 2021

(65) Prior Publication Data

US 2022/0158630 A1     May 19, 2022

(30) Foreign Application Priority Data

Nov. 17, 2020    (JP) ............................. JP2020-190639

(51) Int. Cl.
     *H03K 5/13*      (2014.01)
     *H03K 5/00*      (2006.01)

(52) U.S. Cl.
     CPC ..... *H03K 5/13* (2013.01); *H03K 2005/00195* (2013.01)

(58) Field of Classification Search
     CPC ....................... H03K 5/13; H03K 2005/00195
     USPC ......................................................... 327/261
     See application file for complete search history.

(56) References Cited

U.S. PATENT DOCUMENTS

| | | | | |
|---|---|---|---|---|
| 5,179,539 A * | 1/1993 | Horiguchi | ........... | G11C 11/4074 327/537 |
| 6,310,503 B1 * | 10/2001 | Kim | ........... | H03K 5/08 327/284 |
| 7,746,141 B2 * | 6/2010 | Takahashi | ........... | H03H 11/265 327/264 |
| 7,772,908 B2 * | 8/2010 | Sinha | ........... | G11C 11/406 327/261 |
| 7,932,764 B2 * | 4/2011 | Chou | ........... | H03K 5/133 327/108 |
| 8,242,828 B1 * | 8/2012 | Mai | ........... | H03K 5/133 327/264 |
| 8,564,353 B2 * | 10/2013 | Kuo | ........... | H03H 11/26 327/261 |
| 8,624,652 B1 * | 1/2014 | Bhuiyan | ........... | H03K 5/133 327/263 |

(Continued)

FOREIGN PATENT DOCUMENTS

JP           2010219661       9/2010

OTHER PUBLICATIONS

"Search Report of Europe Counterpart Application", dated Apr. 12, 2022, p. 1-p. 7.

*Primary Examiner* — Ryan Jager
(74) *Attorney, Agent, or Firm* — JCIPRNET

(57) ABSTRACT

Delay circuit includes: first to fourth transistors; capacitor; constant current source; and resistor. The first transistor has a gate connected to an input terminal, a source connected to the first power supply terminal, and a drain. The second transistor has a gate connected to an input terminal and the gate of the first transistor, a drain connected to the drain of the first transistor and the second terminal of the capacitor, and a source. The third transistor has a gate connected to a node between the drain of the first transistor, the drain of the second transistor, and the second terminal of the capacitor, a source connected to the second power supply terminal, and a drain. The fourth transistor has a gate connected to the node and the gate of the third transistor, a drain connected to the drain of the third transistor and an output terminal, and a source.

12 Claims, 7 Drawing Sheets

(56) References Cited

U.S. PATENT DOCUMENTS

| | | | |
|---|---|---|---|
| 2002/0021159 A1 | 2/2002 | Takahashi | |
| 2010/0327902 A1* | 12/2010 | Shau | G11C 11/4093 |
| | | | 257/E21.09 |
| 2013/0134788 A1 | 5/2013 | Noguchi | |
| 2014/0132191 A1* | 5/2014 | Heo | G05F 1/613 |
| | | | 323/283 |
| 2016/0118977 A1 | 4/2016 | Yi et al. | |

* cited by examiner

DELAY CIRCUIT

CROSS-REFERENCE TO RELATED APPLICATIONS

This application claims the priority benefit of Japan Application No. 2020-190639, filed on Nov. 17, 2020. The entirety of the above-mentioned patent application is hereby incorporated by reference herein and made a part of this specification.

BACKGROUND

Technical Field

The present invention relates to a delay circuit.

Description of Related Art

A delay circuit having a capacitor and generating a delay time according to the capacitance value of this capacitor is known (see, for example, Japanese Patent Laid-Open No. 2010-219661).

However, in the delay circuit described above, the larger the delay time to be generated, the larger the capacitance value. An increase in the capacitance value leads to an increase in the size of the capacitor, and thus leads to an increase in the size of the entire delay circuit.

SUMMARY

In consideration of the above-mentioned circumstances, an object of at least one embodiment of the present invention is to provide a delay circuit capable of generating the same delay time as the conventional delay circuit with a size more compact than the conventional delay circuit.

A delay circuit according to at least one embodiment of the present invention, the delay circuit including an input terminal and an output terminal, includes: a first transistor having a gate connected to the input terminal, a source connected to a first power supply terminal which supplies a first power supply voltage, and a drain; a capacitor having a first terminal connected to the first power supply terminal and a second terminal connected to the drain of the first transistor; a second transistor having a gate connected to the gate of the first transistor and the input terminal, a drain connected to the drain of the first transistor and the second terminal of the capacitor, and a source; a first constant current source connected between the source of the second transistor and a second power supply terminal which supplies a second power supply voltage different from the first power supply voltage; a third transistor having a gate connected to a node between the drain of the first transistor, the drain of the second transistor, and the second terminal of the capacitor, a source connected to the second power supply terminal, and a drain; a fourth transistor having a gate connected to the node and the gate of the third transistor, a drain connected to the drain of the third transistor and the output terminal, and a source; and a resistor having a first terminal connected to the source of the fourth transistor and a second terminal connected to the first power supply terminal, the first transistor and the fourth transistor being MOS transistors of a first conductivity type which is one of p-type and n-type, the second transistor and the third transistor being MOS transistors of a second conductivity type which is the other of p-type and n-type.

According to the delay circuit, the same delay time as the conventional delay circuit can be generated with a size more compact than the conventional delay circuit.

DESCRIPTION OF THE EMBODIMENTS

First Embodiment

Figure 1:
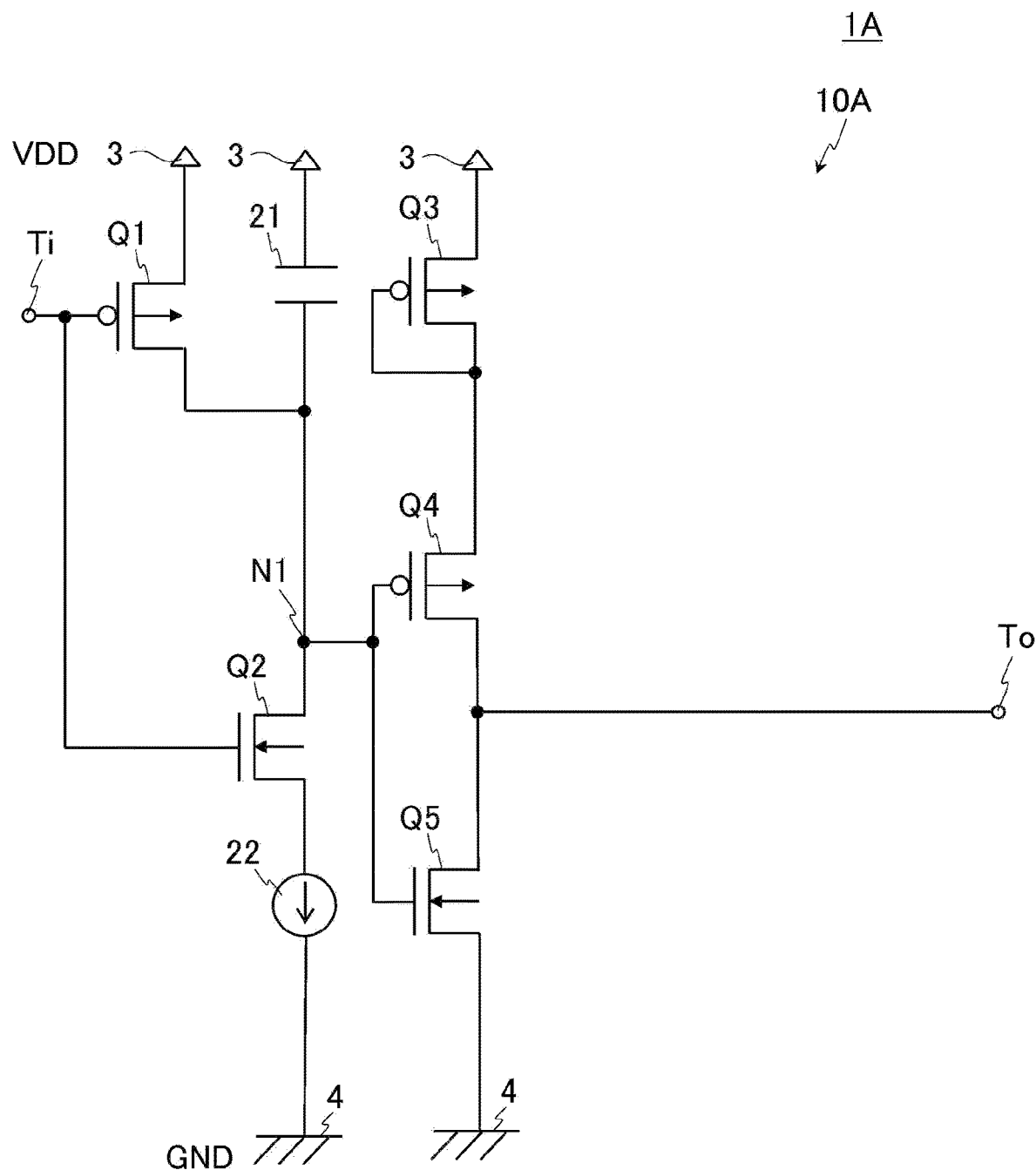
FIG. 1 is a circuit diagram of a delay circuit according to a first embodiment of the present invention.

FIG. 1 is a circuit diagram of a delay circuit 10A which is an example of a delay circuit according to a first embodiment of the present invention.

The delay circuit 10A is formed on, for example, a semiconductor substrate and is provided in a semiconductor device 1A. The delay circuit 10A includes, for example, p-type MOS transistors (hereinafter, referred to as "PMOS transistors") Q1, Q3, and Q4, n-type MOS transistors (hereinafter, referred to as "NMOS transistors") Q2 and Q5, a capacitor 21, and a constant current source 22.

The PMOS transistor Q1 as a first transistor has a gate connected to an input terminal Ti, a source connected to a power supply terminal 3, and a drain. The power supply terminal 3 is a terminal which supplies a voltage VDD as the power supply voltage.

The capacitor 21 is connected between the power supply terminal 3 and the drain of the PMOS transistor Q1. That is, the capacitor 21 has a first terminal connected to the power supply terminal 3 and a second terminal connected to the drain of the PMOS transistor Q1.

The NMOS transistor Q2 as a second transistor has a gate connected to the gate of the PMOS transistor Q1 and the input terminal Ti, a drain connected to the drain of the PMOS transistor Q1 and the second terminal of the capacitor 21, and a source.

The constant current source 22 as a first constant current source is connected between the source of the NMOS transistor Q2 and a ground terminal 4 as the power supply terminal. The ground terminal 4 is a power supply terminal which supplies the ground voltage GND. The ground voltage GND as the power supply voltage is, for example, a reference voltage such as 0 volts, and is a voltage different from the voltage VDD.

The NMOS transistor Q5 as a third transistor has a gate connected to a node N1, a source connected to the ground terminal 4, and a drain. The node N1 is a connection point between the drain of the PMOS transistor Q1, the drain of the NMOS transistor Q2, and the second terminal of the capacitor 21.

The PMOS transistor Q4 as a fourth transistor has a gate connected to the node N1 and the gate of the NMOS transistor Q5, a drain connected to the drain of the NMOS transistor Q5 and an output terminal To, and a source.

The PMOS transistor Q3 as a resistor has a gate and a drain connected (short-circuited), and for example, functions as a resistor having a first terminal which is the mutually connected gate and drain and a second terminal which is the source. The so-called diode-connected PMOS transistor Q3 has a gate and a drain as a first terminal connected to the source of the fourth transistor and a source as a second terminal connected to the power supply terminal 3.

Here, the relationship between the conductivity types of the first to fourth transistors in the delay circuit according to the present embodiment will be described. The conductivity type of the first transistor and the fourth transistor is a first conductivity type which is one of p-type and n-type. On the other hand, the conductivity type of the second transistor and the third transistor is a second conductivity type which is the other of p-type and n-type. That is, the second conductivity type is different from the first conductivity type. In the delay circuit 10A illustrated in FIG. 1, the first conductivity type is p-type and the second conductivity type is n-type.

Next, the operation of the delay circuit 10A will be described.

When a low level (hereinafter referred to as "L-level") voltage is input to the input terminal Ti, the PMOS transistor Q1 is turned on and the NMOS transistor Q2 is turned off. Thus, a voltage VDD, that is, a high level (hereinafter referred to as "H-level") voltage is supplied to the gate of the PMOS transistor Q4 and the gate of the NMOS transistor Q5. Thus, the PMOS transistor Q4 is turned off, the NMOS transistor Q5 is turned on, and the voltage level of the voltage output from the output terminal To transitions to the L-level.

Here, when the voltage level of the voltage input to the input terminal Ti transitions from the L-level to the H-level, the PMOS transistor Q1 transitions from the on-state to the off-state, and the NMOS transistor Q2 transitions from the off-state to the on-state. When the PMOS transistor Q1 is turned off and the NMOS transistor Q2 is turned on, charging of the capacitor 21 with the constant current of the constant current source 22 starts. The capacitor 21 generates a delay time from the timing at which the voltage level of the voltage input to the input terminal Ti transitions to the timing at which the voltage level of the voltage output from the output terminal To transitions. Thus, at the time when the charging of the capacitor 21 starts, the voltage level of the voltage output from the output terminal To is maintained at the L-level.

After that, as the charging progresses, the voltage across the capacitor 21 rises and the voltage at the node N1 falls. Eventually, when the voltage at the node N1 is below a threshold value at which the voltage level of the voltage output from a circuit (inverter) including the NMOS transistor Q3, the PMOS transistor Q4, and the NMOS transistor Q5 transitions (hereinafter, simply referred to as "threshold value"), the voltage level of the output voltage transitions from the L-level to the H-level, and the H-level voltage is supplied from the output terminal To.

In the delay circuit 10A, when the capacitor 21 in the delay circuit 10A and the capacitor in a delay circuit without the PMOS transistor Q3 have the same capacitance value, the threshold value of the circuit including the PMOS transistor Q4 and the NMOS transistor Q5 can be lowered as compared with the delay circuit without the PMOS transistor Q3. Focusing on the delay time, the delay circuit 10A can generate a larger delay time than a delay circuit of the same size without the PMOS transistor Q3.

On the other hand, when the delay time of the delay circuit without with the PMOS transistor Q3 and the delay time of the delay circuit 10A are the same, the capacitance value of the capacitor 21 in the delay circuit 10A can be made smaller than the capacitance value of the capacitor of the delay circuit without the PMOS transistor Q3. Focusing on the circuit size, the delay circuit 10A can have a reduced overall circuit size as compared with a delay circuit having the same delay time without the PMOS transistor Q3.

In the present embodiment, an example in which a single-stage diode-connected PMOS transistor Q3 is applied as a resistor has been described, but the resistor is not limited to this.

The resistor may have a single element or a plurality of elements that generates a predetermined voltage drop, and a diode or a resistance may be applied. The diode includes not only a diode element but also a diode-connected MOS transistor. The resistor may be configured by connecting a plurality of diode-connected MOS transistors, diode elements and resistances in cascade.

Second Embodiment

Figure 2:
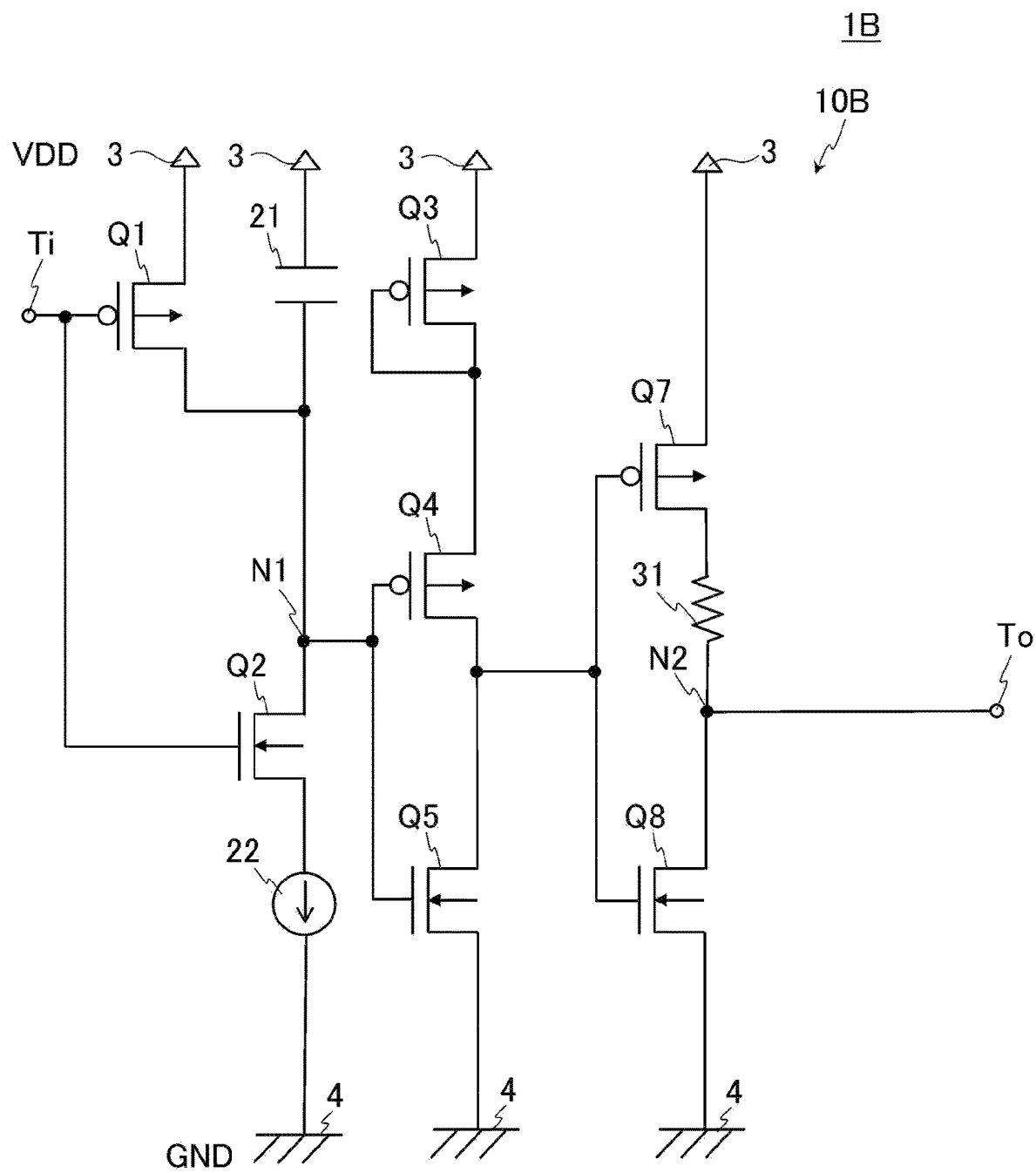
FIG. 2 is a circuit diagram of a delay circuit according to a second embodiment of the present invention.

FIG. 2 is a circuit diagram of a delay circuit 10B which is an example of a delay circuit according to a second embodiment of the present invention.

The delay circuit 10B is substantially the same as the delay circuit 10A except that it includes the PMOS transistor Q3 as a diode instead of the PMOS transistor Q3 as a resistor, and further includes a PMOS transistor Q7, an NMOS transistor Q8, and a resistance 31. In this embodiment, the components, actions, and effects that are different from the delay circuit 10A will be mainly described, and the components that are substantially the same as the delay circuit 10A will be designated by the same reference numerals and description thereof will be omitted.

The delay circuit 10B is formed on a semiconductor substrate, for example, and is provided in a semiconductor device 1B. The delay circuit 10B includes the PMOS transistor Q3 as a resistor, the PMOS transistors Q1 and Q4, the NMOS transistors Q2 and Q5, the capacitor 21, and the constant current source 22, and further includes, for example, a PMOS transistor Q7, an NMOS transistor Q8, and a resistance 31.

The PMOS transistor Q7 as a fifth transistor has a gate connected to the drain of the PMOS transistor Q4, a source connected to the power supply terminal 3, and a drain connected to the first terminal of the resistance 31.

The NMOS transistor Q8 as a sixth transistor has a gate connected to the gate of the PMOS transistor Q7 and the drain of the PMOS transistor Q4, a source connected to the ground terminal 4, and a drain connected to the second terminal of the resistance 31 and the output terminal To. Here, the connection point between the drain of the NMOS transistor Q8 and the second terminal of the resistance 31 is referred to as a node N2. In the delay circuit 10B, the output terminal To is connected to the node N2.

The threshold value of a circuit including the PMOS transistor Q7, the NMOS transistor Q8, and the resistance 31 is set to be lower than a voltage determined by the through-current flowing in the path connected to the drains of the PMOS transistor Q4 and the NMOS transistor Q5, and the PMOS transistor Q3. That is, the NMOS transistor Q8 is configured to turn on when the voltage level of the voltage output from the node between the drain of the PMOS transistor Q4 and the drain of the NMOS transistor Q5 transitions from the L-level to the H-level.

The threshold value of the circuit (inverter) including the PMOS transistor Q7, the NMOS transistor Q8, and the resistance 31 can be adjusted to a desired threshold value by changing the magnitude of the resistance value of the resistance 31.

Here, the relationship between the conductivity types of the first to sixth transistors in the delay circuit according to the present embodiment will be described. The conductivity type of the first, fourth, and fifth transistors is the first conductivity type which is one of p-type and n-type. On the other hand, the conductivity type of the second, third, and sixth transistors is the second conductivity type which is the other of p-type and n-type. That is, the second conductivity type is different from the first conductivity type. In the delay circuit 10B illustrated in FIG. 2, the first conductivity type is p-type and the second conductivity type is n-type.

Next, the operation of the delay circuit 10B will be described. Since the operation of the component overlapping with the delay circuit 10A is substantially the same, the description of the operation will be simplified or omitted.

When an L-level voltage is input to the input terminal Ti, an L-level voltage is output from the node between the drain of the PMOS transistor Q4 and the drain of the NMOS transistor Q5. An L-level voltage is applied to the gate of the PMOS transistor Q7 and the gate of the NMOS transistor Q8, the PMOS transistor Q7 is turned on, and the NMOS transistor Q8 is turned off. Thus, the voltage supplied to the output terminal To from the node between the drain of the PMOS transistor Q7 and the drain of the NMOS transistor Q8 is an H-level voltage.

When the voltage level of the voltage input to the input terminal Ti transitions from the L-level to the H-level, a delay time occurs. After the elapse of the delay time, the voltage level of the voltage output from the node between the drain of the PMOS transistor Q4 and the drain of the NMOS transistor Q5 transitions from the L-level to the H-level.

Immediately after the elapse of the delay time, the voltage output from the node between the drain of the PMOS transistor Q4 and the drain of the NMOS transistor Q5 rises to only a voltage determined by the through-current flowing in the path connected to the drains of the PMOS transistor Q4 and the NMOS transistor Q5 and the PMOS transistor Q3. However, the voltage rise of the voltage output from the node between the drain of the PMOS transistor Q4 and the drain of the NMOS transistor Q5 immediately after the elapse of the delay time causes the NMOS transistor Q8 to transition from the off-state to the on-state.

While the NMOS transistor Q8 transitions from the off-state to the on-state, the PMOS transistor Q7 does not transition from the on-state to the off-state in a stage where the rise of the voltage output from the node between the drain of the PMOS transistor Q4 and the drain of the NMOS transistor Q5 is not sufficient. However, even if the PMOS transistor Q7 remains in the on-state, since the resistance 31 is connected between the drain of the PMOS transistor Q7 and the drain of the NMOS transistor Q8, a voltage drop occurs across the resistance 31.

When the NMOS transistor Q8 transitions from the off-state to the on-state, since a voltage drop occurs across the resistance 31, the voltage supplied from the node between the drain of the PMOS transistor Q7 and the drain of the NMOS transistor Q8 to the output terminal To transitions from the H-level to the L-level. When the PMOS transistor Q7 transitions to the off-state, the voltage supplied to the output terminal To from the node between the drain of the PMOS transistor Q7 and the drain of the NMOS transistor Q8 is an L-level voltage.

In this way, if the NMOS transistor Q8 transitions from the off-state to the on-state, the voltage supplied to the output terminal To from the node between the drain of the PMOS transistor Q7 and the drain of the NMOS transistor Q8 is the L-level voltage regardless of the on/off-state of the PMOS transistor Q7.

According to the delay circuit 10B, the same effect as that of the delay circuit 10A can be obtained. That is, focusing on the circuit size, the delay circuit 10B can generate the same delay time as the conventional delay circuit with a size more compact than the conventional delay circuit. Further, focusing on the delay time, the delay circuit 10B can generate a larger delay time than the conventional delay circuit with the same size as the conventional delay circuit.

According to the delay circuit 10B, the voltage level can reliably transition even immediately after the elapse of the delay time where the voltage output from the drain of the PMOS transistor Q4 and the drain of the NMOS transistor Q5 has not risen sufficiently.

Third Embodiment

Figure 3:
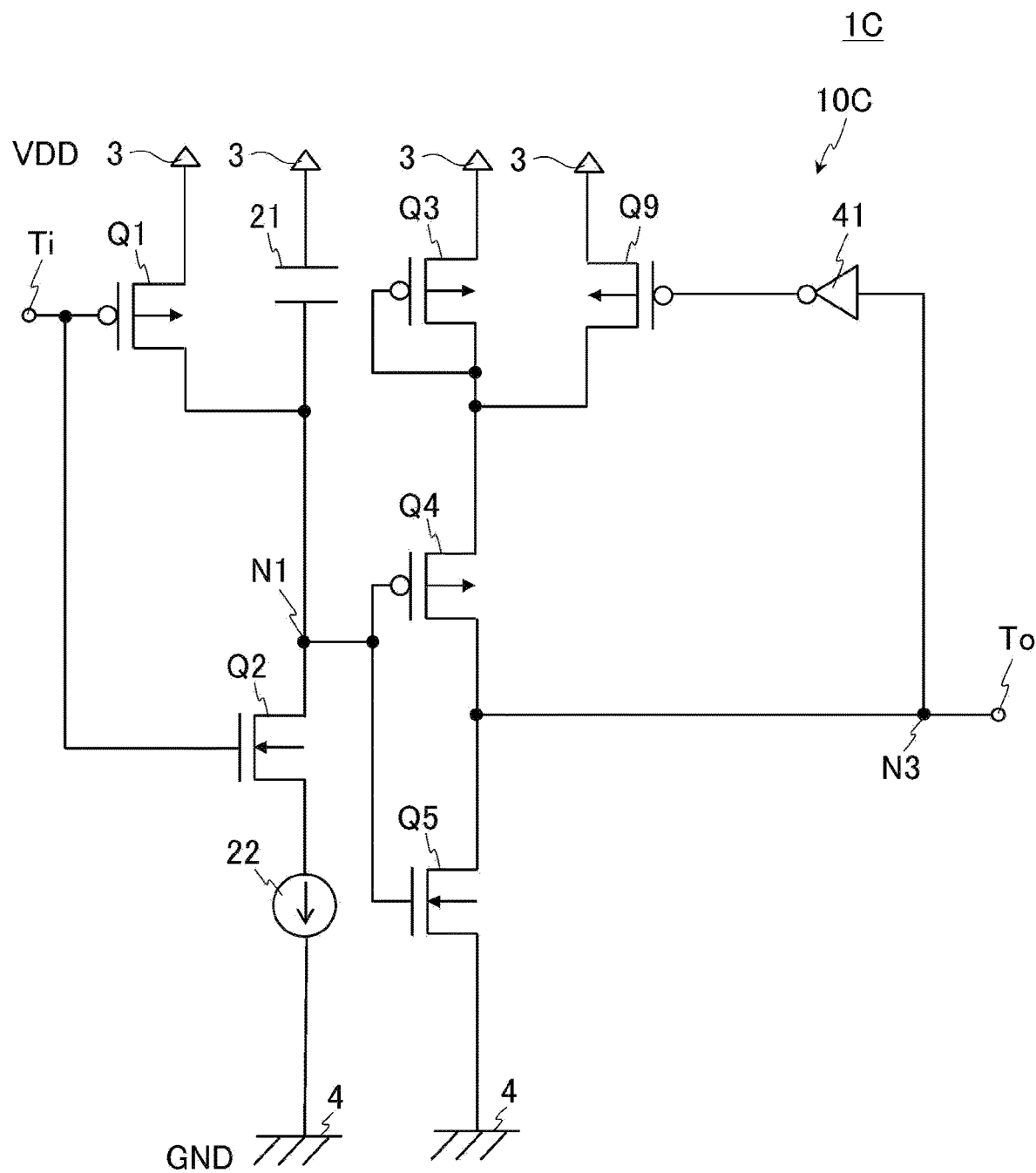
FIG. 3 is a circuit diagram of a delay circuit according to a third embodiment of the present invention.

FIG. 3 is a circuit diagram of a delay circuit 10C which is an example of a delay circuit according to a third embodiment of the present invention.

The delay circuit 10C is substantially the same as the delay circuit 10A except that it further includes a PMOS transistor Q9 and an inverter 41. In this embodiment, the components, actions, and effects that are different from the delay circuit 10A will be mainly described, and the components that are substantially the same as the delay circuit 10A will be designated by the same reference numerals and description thereof will be omitted.

The delay circuit 10C is formed on a semiconductor substrate, for example, and is provided in a semiconductor device 1C. The delay circuit 10C includes the PMOS transistor Q3 as a diode, the NMOS transistors Q1 and Q4, the NMOS transistors Q2 and Q5, the capacitor 21, and the constant current source 22, and, further includes, for example, a PMOS transistor Q9 and an inverter 41. The PMOS transistor Q3 as a diode is connected from the viewpoint of suppressing the current consumption while obtaining a desired voltage drop even if a leak current flows, as compared with the case of using a resistance.

The PMOS transistor Q9 as a seventh transistor has a gate, a source connected to the power supply terminal 3, and a drain connected to the source of the PMOS transistor Q4 and the gate and drain of the diode-connected PMOS transistor Q3.

The inverter 41 has an input terminal connected to the drain of the PMOS transistor Q4 and an output terminal connected to the gate of the PMOS transistor Q9. Here, the connection point between the input terminal of the inverter 41 and the output terminal To is referred to as a node N3. In the delay circuit 10C, the drain of the PMOS transistor Q4 and the drain of the NMOS transistor Q5 are connected to the node N3.

Here, the relationship between the conductivity types of the first to seventh transistors in the delay circuit according to the present embodiment will be described. The conductivity type of the first, fourth, fifth, and seventh transistors is the first conductivity type which is one of p-type and n-type. On the other hand, the conductivity type of the second, third, and sixth transistors is the second conductivity type which is the other of p-type and n-type. That is, the second conductivity type is different from the first conductivity type. In the delay circuit 10C illustrated in FIG. 3, the first conductivity type is p-type and the second conductivity type is n-type.

Next, the operation of the delay circuit 10C will be described. Since the operation of the component overlapping with the delay circuit 10A is substantially the same, the description of the operation will be simplified or omitted.

When an L-level voltage is input to the input terminal Ti, an L-level voltage is output from the node between the drain of the PMOS transistor Q4 and the drain of the NMOS transistor Q5. Here, the gate of the PMOS transistor Q9 receives a voltage based on the voltage output from the drain of the PMOS transistor Q4. In the delay circuit 10C, the voltage output from the node between the drain of the PMOS transistor Q4 and the drain of the NMOS transistor Q5 is supplied to the gate of the NMOS transistor Q9 via the inverter 41. At this time, since an H-level voltage is supplied to the gate of the PMOS transistor Q9, the PMOS transistor Q9 is in the off-state.

When the voltage level of the voltage input to the input terminal Ti transitions from the L-level to the H-level, a delay time occurs. The voltage level of the voltage output from the node between the drain of the PMOS transistor Q4 and the drain of the NMOS transistor Q5 transitions from the L-level to the H-level. Since an L-level voltage is input to the gate of the PMOS transistor Q9 via the inverter 41, the PMOS transistor Q9 is turned on.

When the PMOS transistor Q9 transitions to the on-state, since the on-resistance of the PMOS transistor Q9 is extremely smaller than that of the PMOS transistor Q3, the path connected to the drain of the PMOS transistor Q4 and the power supply terminal 3 via and the PMOS transistor Q3 can be ignored. That is, the drain of the PMOS transistor Q4 is connected to the power supply terminal 3 via the PMOS transistor Q9 in the on-state.

Thus, when the voltage level of the voltage input to the input terminal Ti transitions from the L-level to the H-level, after the elapse of the delay time, the voltage at the node between the drain of the PMOS transistor Q4 and the drain of the NMOS transistor Q5 can be raised to the voltage VDD.

According to the delay circuit 10C, the same effect as that of the delay circuit 10A can be obtained without increasing the current consumption. That is, focusing on the circuit size, the delay circuit 10C can generate the same delay time as the conventional delay circuit without increasing the current consumption and with a size more compact than the conventional delay circuit. Further, focusing on the delay time, the delay circuit 10C can generate a larger delay time than the conventional delay circuit with the same size as the conventional delay circuit without increasing the current consumption.

According to the delay circuit 10C, after the elapse of the delay time, by switching the path of the current flowing from the power supply terminal 3 to the PMOS transistor Q4 from the path passing through the PMOS transistor Q3 to the path passing through the PMOS transistor Q9, the voltage of the drain of the PMOS transistor Q4 and the NMOS transistor Q5 is raised to the voltage VDD. By raising the voltage of the drains of the PMOS transistor Q4 and the NMOS transistor Q5 to the voltage VDD, it is possible to suppress the influence of the through-current flowing through an external circuit when the external circuit is connected to the output terminal To.

In the present embodiment, an example in which a single-stage diode-connected PMOS transistor Q3 is applied as a diode has been described, but the diode is not limited to this.

The diode is not limited to a diode-connected MOS transistor, and a diode element may be applied. The diode may be configured by connecting a plurality of diode-connected MOS transistors or diode elements in cascade.

Fourth Embodiment

Figure 4:
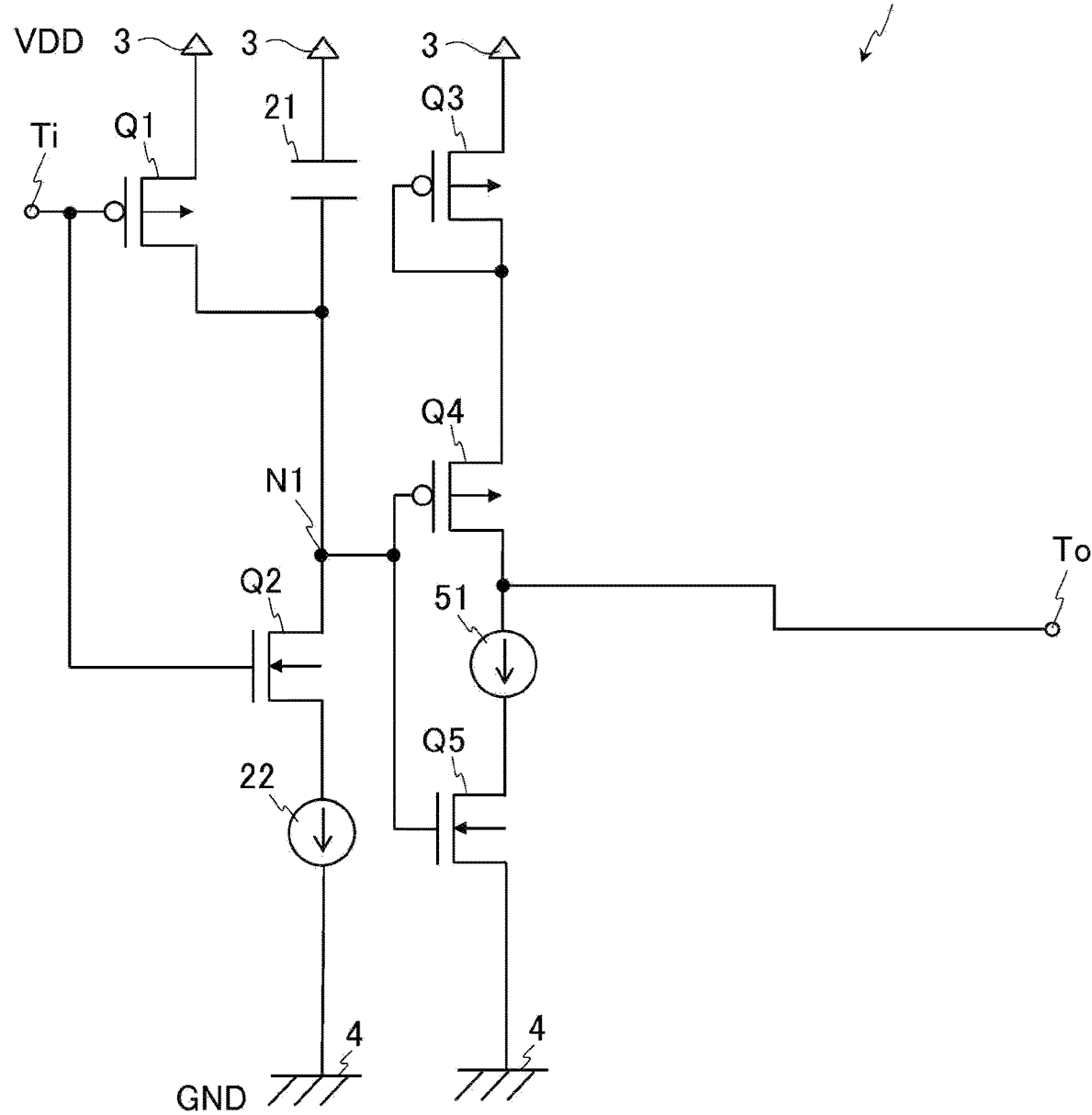
FIG. 4 is a circuit diagram of a delay circuit according to a fourth embodiment of the present invention.

FIG. 4 is a circuit diagram of a delay circuit 10D which is an example of a delay circuit according to a fourth embodiment of the present invention.

The delay circuit 10D is formed on, for example, a semiconductor substrate and is provided in a semiconductor device 1D. The delay circuit 10D is substantially the same as the delay circuit 10A except that it further includes a constant current source 51. In this embodiment, the components, actions, and effects that are different from the delay circuit 10A will be mainly described, and the components that are substantially the same as the delay circuit 10A will be designated by the same reference numerals and description thereof will be omitted.

The delay circuit 10D includes the PMOS transistor Q3 as a resistor, the PMOS transistors Q1 and Q4, the NMOS transistors Q2 and Q5, the capacitor 21, and the constant current source 22, and further includes, for example, a constant current source 51. The constant current source 51 as a second constant current source is connected between the drain of the PMOS transistor Q4 and the drain of the NMOS transistor Q5.

Here, the conductivity type relationship of the first to seventh transistors in the delay circuit according to the present embodiment is the same as the conductivity type relationship of the first to seventh transistors in the delay circuit according to the third embodiment. That is, the first, fourth, fifth, and seventh transistors are of the first conductivity type, and the second, third, and sixth transistors are of the second conductivity type. In the delay circuit 10D illustrated in FIG. 4, the first conductivity type is an example of p-type, and the second conductivity type is an example of n-type.

Next, the operation of the delay circuit 10D will be described. Since the operation of the component overlapping with the delay circuit 10A is substantially the same, the description of the operation will be simplified or omitted.

When an L-level voltage is input to the input terminal Ti, an L-level voltage is output from the node between the drain of the PMOS transistor Q4 and the constant current source 51. The constant current source 51 supplies a predetermined constant current to the drain of the NMOS transistor Q5.

When the voltage level of the voltage input to the input terminal Ti transitions from the L-level to the H-level, a delay time occurs. After the elapse of the delay time, the voltage level of the voltage output from the node between the drain of the PMOS transistor Q4 and the constant current source 51 transitions from the L-level to the H-level.

Here, the threshold value of a circuit including the PMOS transistor Q3, the PMOS transistor Q4, the constant current source 51, and the NMOS transistor Q5 is determined by the predetermined constant current supplied by the constant current source 51, the voltage determined by the PMOS transistor Q3, and the gate-source voltage of the PMOS transistor Q4. On the other hand, the threshold value of a circuit which does not have the constant current source 51 connected between the drain of the PMOS transistor Q4 and the drain of the NMOS transistor Q5 and includes the PMOS transistor Q3, the PMOS transistor Q4, and the NMOS transistor Q5 is determined by the threshold voltage of the PMOS transistor Q4, the threshold voltage of the NMOS transistor Q5, and the voltage dropped by the MIMO transistor Q3.

Thus, in the delay circuit without the constant current source 51, the delay time to be generated is affected by the voltage VDD of the power supply terminal 3. That is, in a delay circuit that does not have the constant current source 51 connected between the drain of the PMOS transistor Q4 and the drain of the NMOS transistor Q5, the delay time to be generated is highly dependent on the voltage VDD.

On the other hand, in a delay circuit including the constant current source 51 connected between the drain of the PMOS transistor Q4 and the drain of the NMOS transistor Q5 such as the delay circuit 10D, the delay time to be generated is not affected by the voltage VDD of the power supply terminal 3. That is, a delay time that does not depend on the voltage VDD is generated.

According to the delay circuit 10D, the same effect as that of the delay circuit 10A can be obtained. That is, focusing on the circuit size, the delay circuit 10D can generate the same delay time as the conventional delay circuit with a size more compact than the conventional delay circuit. Further, focusing on the delay time, the delay circuit 10D can generate a larger delay time than the conventional delay circuit with the same size as the conventional delay circuit.

According to the delay circuit 10D, since the constant current source 51 is provided, it is possible to generate a delay time that does not depend on the voltage VDD.

The present invention is not limited to the above-described embodiments as they are, and can be implemented in various forms other than the above-mentioned examples at the implementation stage, and various omissions, replacements, and changes can be made within the range without departing from the spirit of the present invention. For example, in addition to the above-described configuration example, the present invention can be modified to configurations (first, second, and third modifications) in which the components of the delay circuits 10A to 10D are appropriately combined, such as the delay circuits 10E, 10F, and 10G described later.

Figure 5:
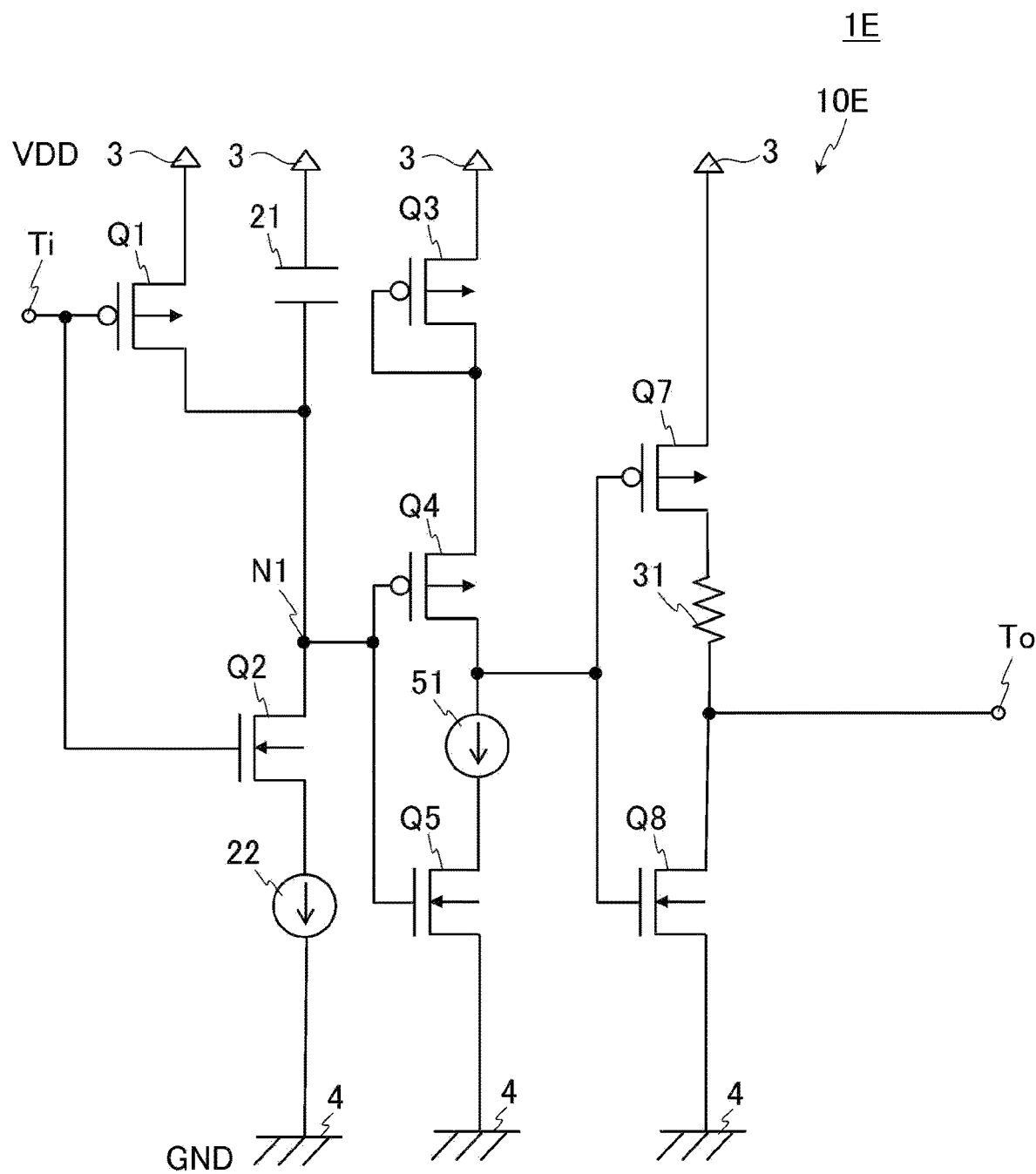
FIG. 5 is a circuit diagram illustrating a first modification of the delay circuit according to the embodiment of the present invention.
Figure 6:
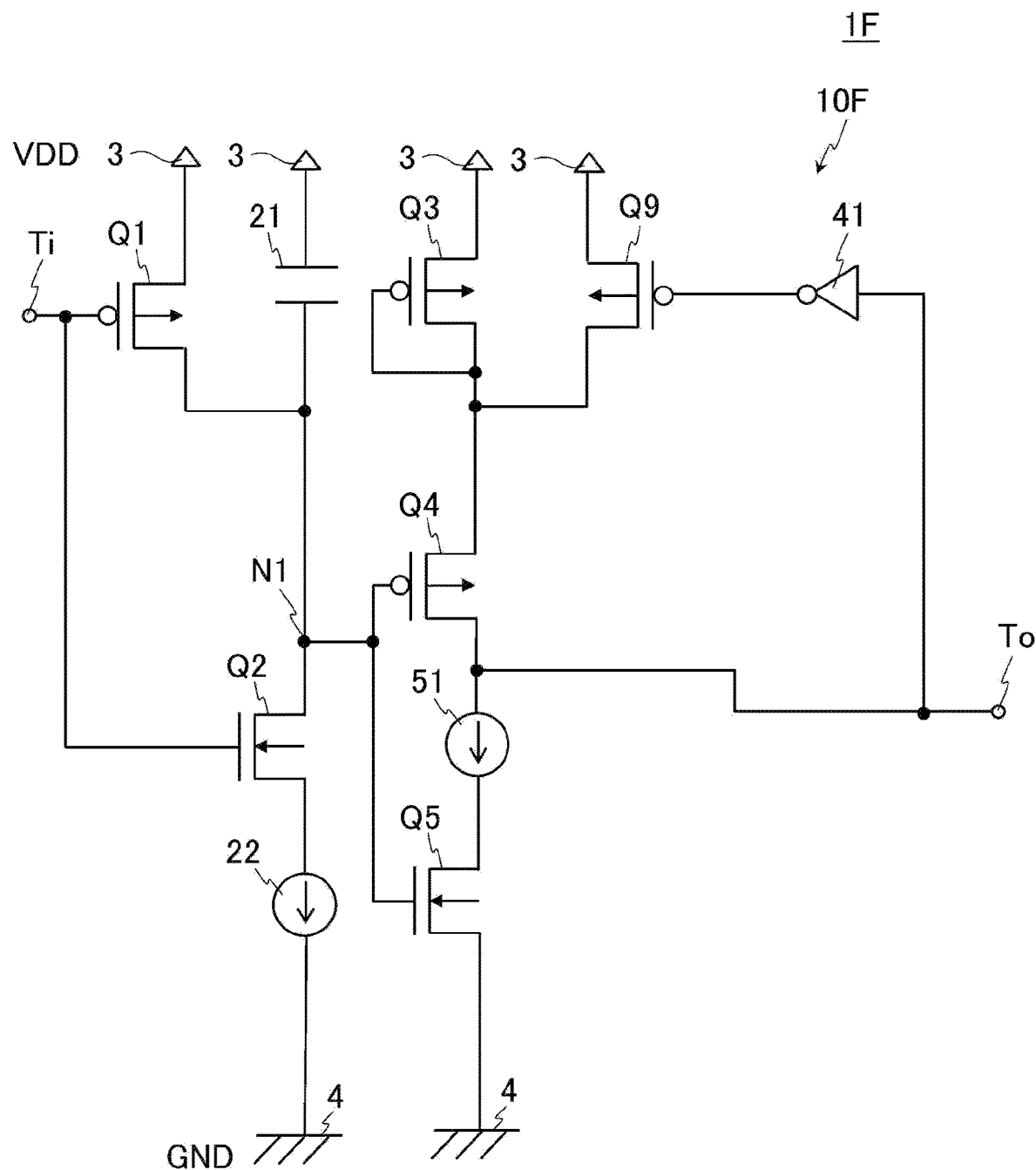
FIG. 6 is a circuit diagram illustrating a second modification of the delay circuit according to the embodiment of the present invention.
Figure 7:
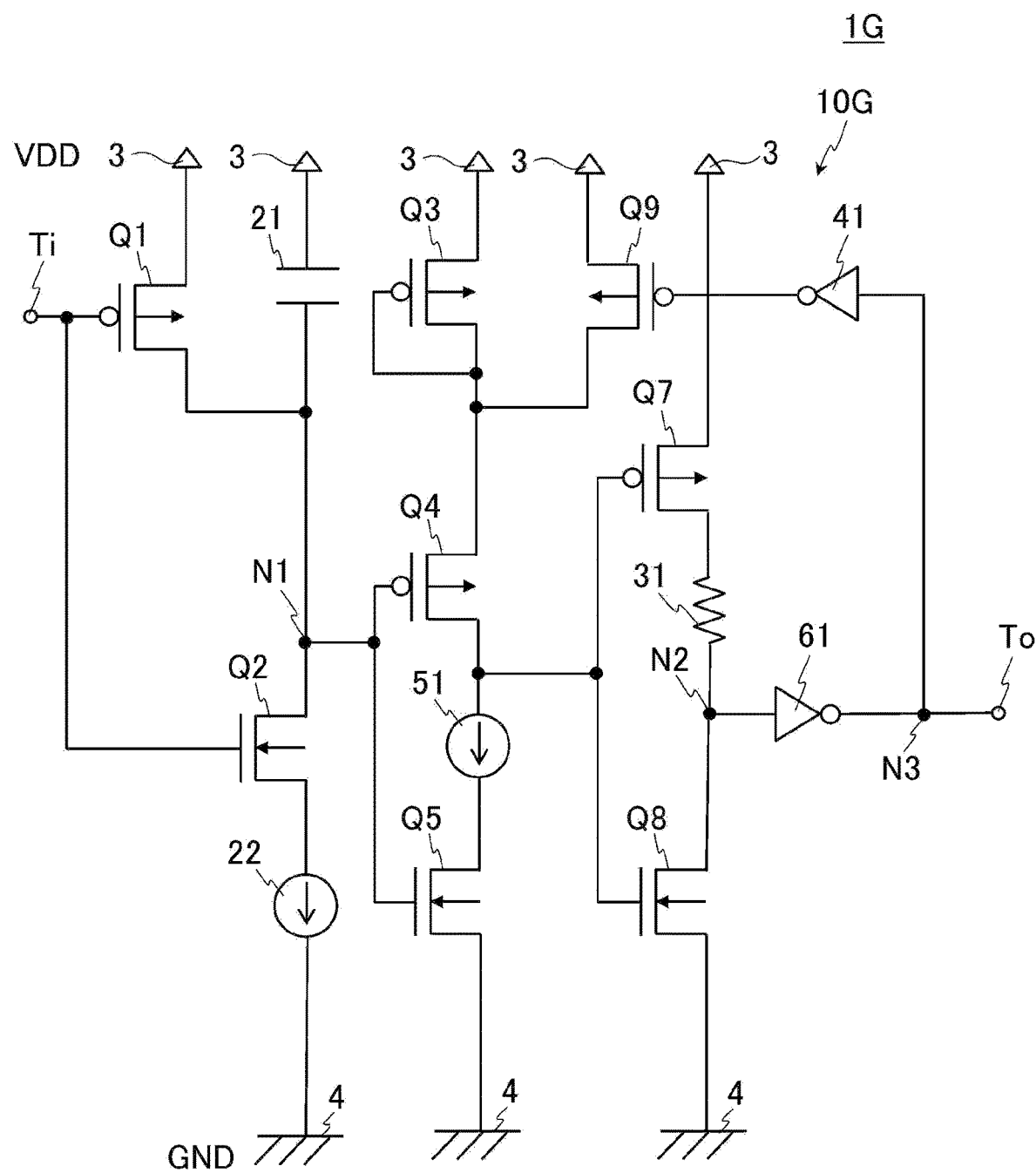
FIG. 7 is a circuit diagram illustrating a third modification of the delay circuit according to the embodiment of the present invention.

FIGS. 5, 6 and 7, respectively, are circuit diagrams of the delay circuit 10E, the delay circuit 10F, and the delay circuit 10G, which are the first modification, the second modification, and the third modification of the delay circuit according to the embodiment of the present invention.

The delay circuits 10E, 10F, and 10G are formed on a semiconductor substrate and are provided in semiconductor devices 1E, 1F, and 1G, for example, similarly to the delay circuits 10A to 10D described above. The delay circuit 10E is configured to further include a constant current source 51 with respect to the delay circuit 10B. That is, the delay circuit 10E is configured to further include the PMOS transistor Q7, the NMOS transistor Q8, the resistance 31, and the constant current source 51 with respect to the delay circuit 10A. According to the delay circuit 10E, the same effect as that of the delay circuits 10A, 10B, 10D can be obtained.

The delay circuit 10F is configured to further include a constant current source 51 with respect to the delay circuit 10C. That is, the delay circuit 10F is configured to further include the PMOS transistor Q9, the inverter 41, and the constant current source 51 with respect to the delay circuit 10A. According to the delay circuit 10F, the same effect as that of the delay circuits 10A, 10C, 10D can be obtained.

The delay circuit 10G is configured to further include the PMOS transistor Q9, the inverter 41, and the inverter 61 with respect to the delay circuit 10E. That is, the delay circuit 10G is configured to further include the PMOS transistor Q7, the NMOS transistor Q8, the resistance 31, the constant current source 51, the PMOS transistor Q9, the inverter 41, and the inverter 61 with respect to the delay circuit 10A. The inverter 61 has an input terminal connected to the node N2 and an output terminal connected to the node N3. According to the delay circuit 10G, the same effect as that of the delay circuits 10A, 10B, 10C, and 10D can be obtained.

A delay circuit may be configured by omitting at least one of the two inverters 41 and 61 and the constant current source 51 from the delay circuit 10G. In the delay circuit in which the two inverters 41 and 61 are omitted from the delay circuit 10G, the voltage based on the voltage output from the drain of the MOS transistor Q4 is applied directly to the gate of the PMOS transistor Q9.

In the delay circuit according to the present embodiment described above, the voltage input to the input terminal Ti may be output from the output terminal To by inverting the voltage level. In this case, for example, the delay circuit 10G may be modified by changing the connection position of the inverter 41 or the inverter 61. Specifically, in the delay circuit 10G, the inverter 61 may be provided on the path connecting the node N3 and the gate of the PMOS transistor Q9, or the inverter 41 may be provided on the path connecting the node N2 and the node N3.

As another configuration example of the delay circuit according to the embodiment, the conductivity type (p-type and n-type) of the semiconductor element and the connection relationship between the terminals and the elements may be inverted with respect to the delay circuit described above.

It will be apparent to those skilled in the art that various modifications and variations can be made to the disclosed embodiments without departing from the scope or spirit of the present invention. In view of the foregoing, it is intended that the present invention covers modifications and variations provided that they fall within the scope of the following claims and their equivalents.

What is claimed is:

1. A delay circuit including an input terminal and an output terminal, the delay circuit comprising:
    a first transistor having a gate connected to the input terminal, a source connected to a first power supply terminal which supplies a first power supply voltage, and a drain;
    a capacitor having a first terminal connected to the first power supply terminal and a second terminal connected to the drain of the first transistor;
    a second transistor having a gate connected to the gate of the first transistor and the input terminal, a drain connected to the drain of the first transistor and the second terminal of the capacitor, and a source;
    a first constant current source connected between the source of the second transistor and a second power supply terminal which supplies a second power supply voltage different from the first power supply voltage;
    a third transistor having a gate connected to a node between the drain of the first transistor, the drain of the second transistor, and the second terminal of the capacitor, a source connected to the second power supply terminal, and a drain;

a fourth transistor having a gate connected to the node and the gate of the third transistor, a drain connected to the drain of the third transistor and the output terminal, and a source;

a resistor having a first terminal connected to the source of the fourth transistor and a second terminal connected to the first power supply terminal;

a fifth transistor and a sixth transistor connected between the drain of the fourth transistor and the output terminal; and a resistance having a first terminal and a second terminal, the first transistor and the fourth transistor being MOS transistors of a first conductivity type which is one of p-type and n-type, the second transistor and the third transistor being MOS transistors of a second conductivity type which is the other of p-type and n-type, the fifth transistor being a MOS transistor of the first conductivity type, the fifth transistor having a gate connected to the drain of the fourth transistor, a source connected to the first power supply terminal, and a drain connected to the first terminal of the resistance, the sixth transistor being a MOS transistor of the second conductivity type, the sixth transistor having a gate connected to the gate of the fifth transistor and the drain of the fourth transistor, a source connected to the second power supply terminal, and a drain connected to the second terminal of the resistance and the output terminal.

2. The delay circuit according to claim 1, wherein the resistor is a diode having a first terminal connected to the source of the fourth transistor and a second terminal connected to the first power supply terminal, the delay circuit further comprising:

a seventh transistor having a gate connected to the drain of the sixth transistor, the second terminal of the resistance, and the output terminal, a source connected to the first power supply terminal, and a drain connected to the source of the fourth transistor and the first terminal of the diode.

3. The delay circuit according to claim 2, wherein a voltage based on a voltage output from the drain of the fourth transistor is supplied to the gate of the seventh transistor.

4. The delay circuit according to claim 3, further comprising:

a second constant current source connected between the drain of the fourth transistor and the drain of the third transistor.

5. The delay circuit according to claim 2, further comprising:

a second constant current source connected between the drain of the fourth transistor and the drain of the third transistor.

6. The delay circuit according to claim 1, wherein the resistor is a diode having a first terminal connected to the source of the fourth transistor and a second terminal connected to the first power supply terminal, the delay circuit fiirther comprising:

a seventh transistor having a gate, a source connected to the first power supply terminal, and a drain connected to the source of the fourth transistor and the first terminal of the diode; and an inverter having an input terminal connected to the drain of the fourth transistor and an output terminal connected to the gate of the seventh transistor.

7. The delay circuit according to claim 6, further comprising:

a second constant current source connected between the drain of the fourth transistor and the drain of the third transistor.

8. The delay circuit according to claim 1, wherein the resistor is a diode having a first terminal connected to the source of the fourth transistor and a second terminal connected to the first power supply terminal, the delay circuit further comprising:

a seventh transistor having a gate, a source connected to the first power supply terminal, and a drain connected to the source of the fourth transistor and the first terminal of the diode, and a voltage based on a voltage output from the drain of the fourth transistor is supplied to the gate of the seventh transistor.

9. The delay circuit according to claim 8, further comprising:

a second constant current source connected between the drain of the fourth transistor and the drain of the third transistor.

10. The delay circuit according to claim 1, further comprising:

a second constant current source connected between the drain of the fourth transistor and the drain of the third transistor.

11. A delay circuit including an input terminal and an output terminal, the delay circuit comprising:

a first transistor having a gate connected to the input terminal, a source connected to a first power supply terminal which supplies a first power supply voltage, and a drain;

a capacitor having a first terminal connected to the first power supply terminal and a second terminal connected to the drain of the first transistor;

a second transistor having a gate connected to the gate of the first transistor and the input terminal, a drain connected to the drain of the first transistor and the second terminal of the capacitor, and a source;

a first constant current source connected between the source of the second transistor and a second power supply terminal which supplies a second power supply voltage different from the first power supply voltage;

a third transistor having a gate connected to a node between the drain of the first transistor, the drain of the second transistor, and the second terminal of the capacitor, a source connected to the second power supply terminal, and a drain;

a fourth transistor having a gate connected to the node and the gate of the third transistor, a drain connected to the drain of the third transistor and the output terminal, and a source; and a resistor having a first terminal connected to the source of the fourth transistor and a second terminal connected to the first power supply terminal, the first transistor and the fourth transistor being MOS transistors of a first conductivity type which is one of p-type and n-type, the second transistor and the third transistor being MOS transistors of a second conductivity type which is the other of p-type and n-type; and a second constant current source connected between the drain of the fourth transistor and the drain of the third transistor.

12. A delay circuit including an input terminal and an output terminal, the delay circuit comprising:
- a first transistor having a gate connected to the input terminal, a source connected to a first power supply terminal which supplies a first power supply voltage, and a drain;
- a capacitor having a first terminal connected to the first power supply terminal and a second terminal connected to the drain of the first transistor;
- a second transistor having a gate connected to the gate of the first transistor and the input terminal, a drain connected to the drain of the first transistor and the second terminal of the capacitor, and a source;
- a first constant current source connected between the source of the second transistor and a second power supply terminal which supplies a second power supply voltage different from the first power supply voltage;
- a third transistor having a gate connected to a node between the drain of the first transistor, the drain of the second transistor, and the second terminal of the capacitor, a source connected to the second power supply terminal, and a drain;
- a fourth transistor having a gate connected to the node and the gate of the third transistor, a drain connected to the drain of the third transistor and the output terminal, and a source; and
- a resistor having a first terminal connected to the source of the fourth transistor and a second terminal connected to the first power supply terminal,
- the first transistor and the fourth transistor being MOS transistors of a first conductivity type which is one of p-type and n-type,
- the second transistor and the third transistor being MOS transistors of a second conductivity type which is the other of p-type and n-type, wherein the resistor is a diode having a first terminal connected to the source of the fourth transistor and a second terminal connected to the first power supply terminal; and
- a seventh transistor having a gate, a source connected to the first power supply terminal, and a drain connected to the source of the fourth transistor and the first terminal of the diode, and
- a voltage based on a voltage output from the drain of the fourth transistor is supplied to the gate of the seventh transistor.

* * * * *